United States Patent [19]

Suzuki

[11] Patent Number: 4,467,341
[45] Date of Patent: Aug. 21, 1984

[54] CHARGE TRANSFER IMAGING DEVICE WITH BLOOMING OVERFLOW DRAIN BENEATH TRANSFER CHANNEL

[75] Inventor: Nobuo Suzuki, Yokohama, Japan

[73] Assignee: Tokyo Shibaura Denki Kabushiki Kaisha, Japan

[21] Appl. No.: 461,516

[22] Filed: Jan. 27, 1983

[30] Foreign Application Priority Data

Feb. 12, 1982 [JP] Japan ............................. 57-20804

[51] Int. Cl.$^3$ ............... H01L 29/78; H01L 27/14; H01L 31/00
[52] U.S. Cl. ............................. 357/24; 357/30; 357/20
[58] Field of Search ............ 357/24 LR, 30; 377/57-63

[56] References Cited

U.S. PATENT DOCUMENTS 3,896,474  7/1975  Amelio et al. ............... 357/24 M
3,896,485  7/1975  Early ............................... 357/24 M
4,373,167  2/1983  Yamada ......................... 357/24 LR

OTHER PUBLICATIONS

"CCD Linear Image Sensor With Buried Overflow Drain Structure," H. Goto et al., Electronics Letters, vol. 17, No. 24, pp. 904-905, (Nov. 26, 1981).

Primary Examiner—Gene M. Munson
Attorney, Agent, or Firm—Finnegan, Henderson, Farabow, Garrett & Dunner

[57] ABSTRACT

A charge trasfer imaging device is disclosed, which comprises photosensitive sites formed in and continuous to the surface of a semiconductor substrate for generating and storing signal charge in response to an incident light signal, a shift electrode for controlling the transfer of the signal charge through the semiconductor substrate, and a charge transfer shift register for reading out the signal charge by transferring the same from the shift electrode through transfer channels formed in and continuous to the semiconductor substrate surface. Semiconductor region of the opposite conductivity type to the semiconductor substrate is formed in the substrate other than a portion of the substrate below the photosensitive sites and at least under the transfer channels of the shift register, and a reverse bias voltage is applied between these semiconductor regions and the semiconductor substrate.

3 Claims, 10 Drawing Figures

CHARGE TRANSFER IMAGING DEVICE WITH BLOOMING OVERFLOW DRAIN BENEATH TRANSFER CHANNEL

BACKGROUND OF THE INVENTION

This invention relates to a charge transfer imaging device.

Solid-state imaging devices using charge transfer devices (CTD) such as charge coupled devices (CCD) are recently extensively used because they have many advantages such as ease of size reduction.

The CTD has photosensitive sites such as PN diodes formed in superficial portions on a p-type semiconductor substrate for generating and storing signal charge according to incident light. The signal charge stored in the photosensitive sites is transferred to a charge transfer shift register by opening a shift electrode or transfer gate after a predetermined period of time. Then, after closing the shift electrode, the transferred signal charge can be read out as an electric signal from an output terminal by impressing a clock pulse on transfer electrodes.

This CTD, however, has a drawback that where high intensity light is irradiated and the period of reading from the shift register is long or where the incident light to be photoelectrically converted is of a long wavelength range near infrared, electrons generated in the semiconductor substrate other than the photosensitive sites are liable to flow into the shift register to deteriorate the image signal.

To overcome this drawback, there has been proposed an overflow drain, i.e., a reverse biased n-region buried under photosites arranged in p-layer, as disclosed in H. Goto et al, "CCD Linear Image Sensor with Buried Over-flow Drain Structure," Electronics Letter, 26th November 1981, vol. 17, No. 24, pp 904-905. The overflow drain here serves to discharge electrons generated outside the photosites. Thus, undesired carriers can be prevented from entering the shift register, and thus it is possible to alleviate the deterioration of image. Further, it is possible to prevent a blooming effect that may otherwise result when the photosites are saturated.

In this structure of CTD, however, it is liable that the carriers which are to be stored in the photosites partly flow into the overflow drain. Particularly, where the incident light to be detected is of a long wavelength range near infrared, the charge tends to be discharged to the overflow drain, thus lowering the sensitivity.

SUMMARY OF THE INVENTION

An object of the invention is to provide a charge transfer imaging device, which is highly sensitive to incident light of even a long wavelength range and which can reduce deterioration of the image signal due to instruction of carriers generated in the semiconductor substrate into the charge transfer shift register.

To attain the above object, according to the invention a semiconductor region of the opposite conductivity type to the semiconductor substrate is formed in a portion of the substrate other than the portion of said substrate below the photosensitive sites and at least beneath the transfer channel of charge transfer shift register. A reverse bias voltage is applied between this semiconductor region and the substrate.

With the above construction, it is possible to prevent unnecessary carriers generated in the semiconductor from reaching the shift register and also to prevent effective carriers generated by the incident light of long wavelength range from being drained away.

Particularly, with an auto focusing camera a light source which emits light near infrared is often used to obtain data of a foreground subject when the background is dark while using a light source emitting visible light when the background is bright.

With the charge transfer imaging device according to the invention, when used for the auto focusing camera as noted above, it is possible to prevent unnecessary carriers generated in the semiconductor substrate from reaching the shift register and also to prevent the blooming effect due to saturation of photosensitive sites when intense visible light or light near infrared is used.

Also, when light near infrared is used for imaging, the signal charge generated is drained to a lesser extent compared to the prior art charge transfer imaging device. Thus, it is possible to improve the sensitivity to light near infrared.

BRIEF DESCRIPTION OF THE DRAWINGS

The above and other objects and advantages of the invention will be apparent from the following description taken in conjunction with the accompanying drawings, in which.

DETAILED DESCRIPTION OF THE PREFERRED EMBODIMENTS

Figure 1:
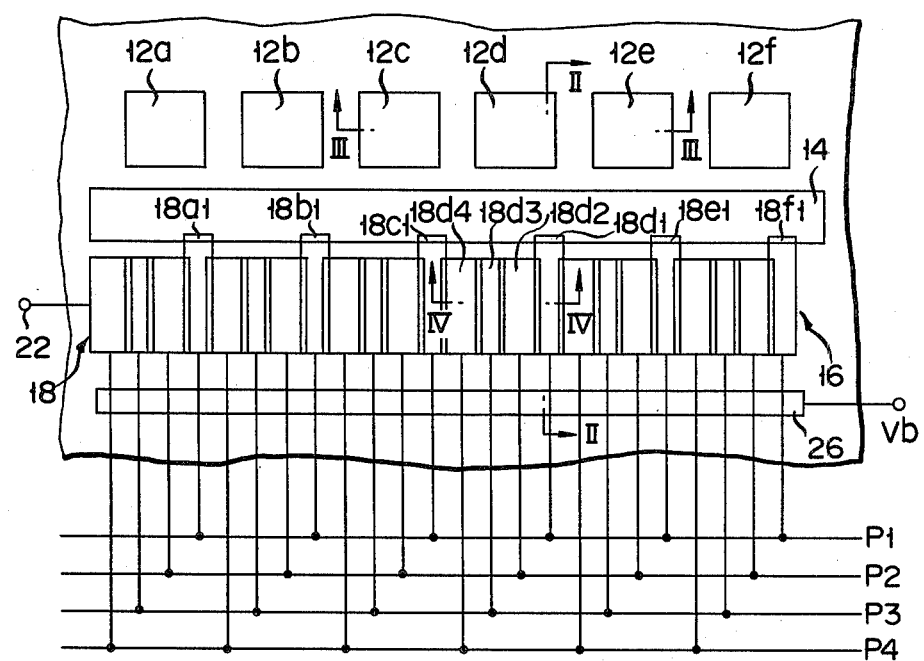
FIG. 1 is a pictorial plan view representation of a charge transfer imaging device according to the invention.
Figure 2:
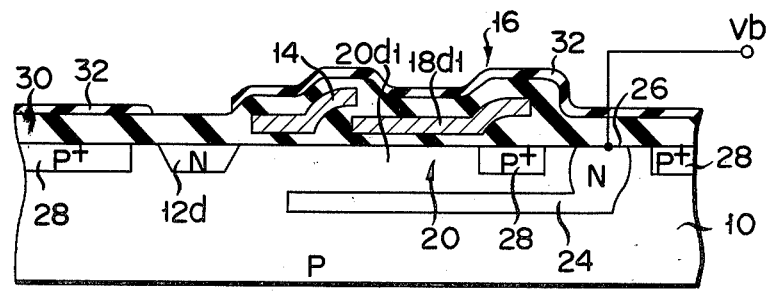
FIG. 2 is a fragmentary sectional view, on an enlarged scale, taken along line II—II in FIG. 1.
Figure 3:
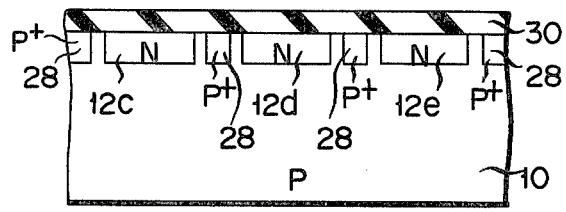
FIG. 3 is a fragmentary sectional view, on an enlarged scale, taken along line III—III in FIG. 1.
Figure 4:
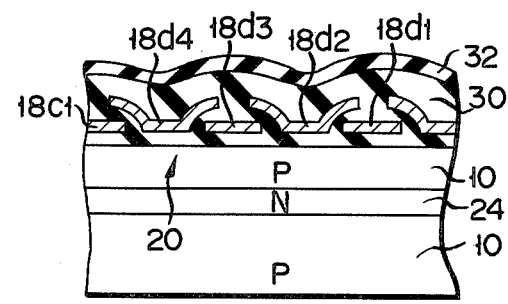
FIG. 4 is a fragmentary sectional view, on an enlarged scale, taken along line IV—IV in FIG. 1.

Now, a first embodiment of the charge transfer imaging device according to the invention will be described with reference to FIGS. 1 to 4.

The charge transfer imaging device illustrated comprises a p-type semiconductor substrate 10, on which photosensitive sites 12a to 12f for generating and storing a signal charge according to the incident light are formed. The photosensitive sites 12a to 12f are n-type semiconductor regions. A shift electrode (or transfer gate) 14 is formed over the semiconductor substrate 10 in the vicinity of the photosensitive sites 12a to 12f via an insulating film 30. This shift electrode 14 is common to all the photosensitive sites 12a to 12f. A charge transfer shift register 16 is formed on the side of the shift electrode 14 opposite the photosensitive sites 12a to 12f. The charge transfer shift register 16 includes a plurality of transfer electrodes 18 and transfer channels 20. In this embodiment, the charge transfer shift register consists of unit cells each containing four electrodes. For example, a unit cell corresponding to the photosensitive site 12d includes electrodes 18d1, 18d2, 18d3 and 18d4. These electrodes are connected to respective power supplies P1, P2, P3 and P4. The electrodes 18d1 to 18d4 are formed over the substrate 10 via the insulating film 30. Of the electrodes 18, the electrodes 18a1, 18b1, . . . , 18f1 for the respective photosensitive sites 12a, 12b, . . ., 12f are formed such that they partly overlap the shift electrode 14 so that the charge generated in the photosensitive sites 12a to 12f may be transferred through the shift electrode 14 to the shift register 16. When the shift electrode 14 is activated or opened, a charge stored in, for instance, the photosensitive site 12d is transferred to a transfer channel 20d1 extending beneath the transfer electrode 18d1. The charge that is transferred in the above way can be subsequently read out as electric signal by de-energizing the shift electrode 14 and then applying a clock pulse to the transfer electrodes 18 in the shift register 16.

In the charge transfer imaging device according to the invention, an n-type semiconductor region 24 is formed in the semiconductor substrate 10 under each transfer channel 20 of the shift register 16. The semiconductor region 24 is formed to extend to a depth of several $\mu$ to 20$\mu$ from the surface of the semiconductor substrate 10. A reverse bias voltage Vb is applied between the semiconductor region 24 and substrate 10 through a contact hole 26. The gist of the invention resides in that the n-type semiconductor regions 24 are formed under the transfer channels 20 of the shift register 16 but not under the photosensitive sites 12a to 12f. That is, the n-type semiconductor regions 24 may be formed in any other part of the semiconductor substrate 10 as well so long as the condition noted above is satisfied.

Further, p+-type channel stoppers 28 are formed to extend in the gaps between adjacent ones of the photosensitive sites 12a to 12f on the surface of the semiconductor substrate 10 and other necessary portions of the device. A light shield film 32 is formed on the insulating film 30 other than the portions thereof on the photosensitive sites 12a to 12f.

Figure 5A:
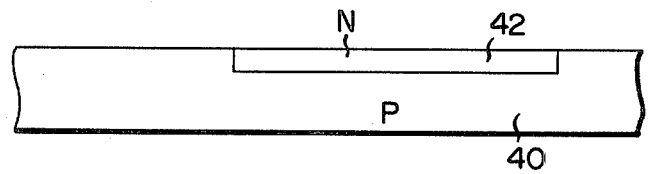
FIGS. 5A to 5C are fragmentary sectional views showing a process of manufacture of a semiconductor substrate used for a charge transfer imaging device according to the invention.
Figure 5B:
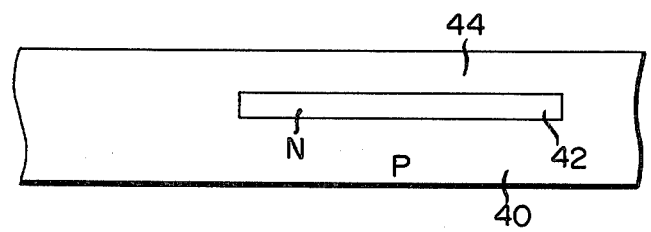
Figure 5C:
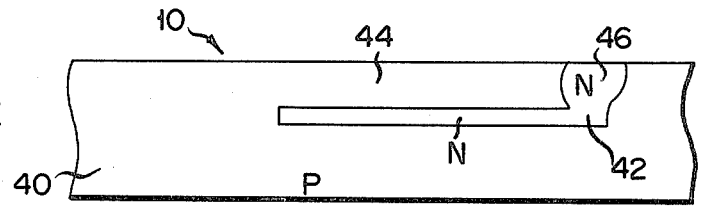

The semiconductor region 24 is formed through a process as shown in FIGS. 5A to 5C. As shown in FIG. 5A, an n-type semiconductor layer 42 is formed in a given superficial portion of a p-type semiconductor substrate 40 by ion implanting, phosphorus for instance. Then, a p-type semiconductor layer 44, as shown in FIG. 5B, is epitaxially grown on the p-type semiconductor substrate including the n-type semiconductor layer 42. Then, an n-type layer 46 connected to the n-type semiconductor layer 42, as shown in FIG. 5C, is formed by thermally diffusing an n-type impurity into a given superficial portion of the p-type semiconductor layer 44. The charge transfer imaging device as shown in FIGS. 1 to 4 is formed in the surface of the semiconductor substrate 10 thus formed.

With the charge transfer imaging device having the construction as described above, the photosensitive sites 12a to 12f generate and store signal charge according to light incident on them. The signal charge thus generated can be read out by applying a clock pulse to the transfer electrodes 18 in the shift register 16. According to the invention, carriers that may be generated in the semiconductor substrate 10 in the vicinity of, for instance, the photosensitive site 12d due to the incident of long wavelength light on the site, can be mostly stored in the site due to a diffusing effect. This is so because unlike the prior art charge transfer imaging device there is no drain region for carriers under the photosensitive site 12d. Thus, it is possible to improve the sensitivity to long wavelength light. According to the invention, the n-type semiconductor region 24, which is reversely biased, is also provided under each transfer channel 20 of the shift register 16. When light in the ordinary wavelength range or near infrared is incident, some of electrons generated in the semiconductor substrate 10 move toward the transfer channel 20 due to the diffusion effect. These electrons are captured in the semiconductor region 24 and drained. Thus, when detecting highly intense light, intrusion of unnecessary electrons into the shift register 16 can be prevented or greatly reduced to alleviate deterioration of the image signal. The charge transfer imaging device according to the invention thus is particularly useful in its auto focusing camera application where an infrared LED light source used when imaging is done in a dark background while a visible light source is used when the background is bright.

Figure 6:
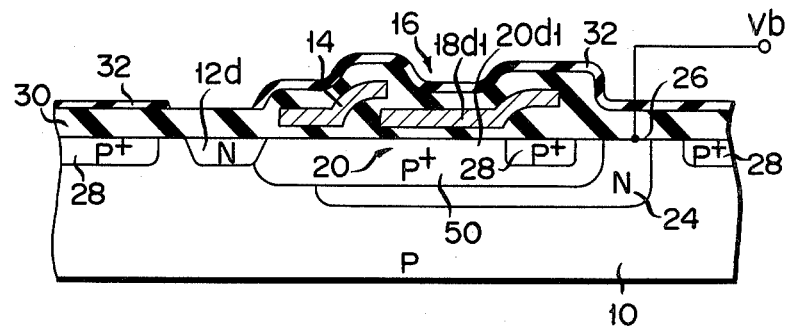
FIG. 6 is a view similar to FIG. 2 but showing a different embodiment of the charge transfer imaging device according to the invention.
Figure 7A:
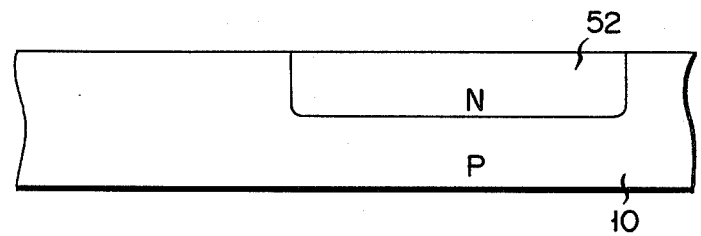
FIGS. 7A and 7B are fragmentary sectional views showing a process of manufacture of a semiconductor substrate used for the charge transfer imaging device shown in FIG. 6.
Figure 7B:
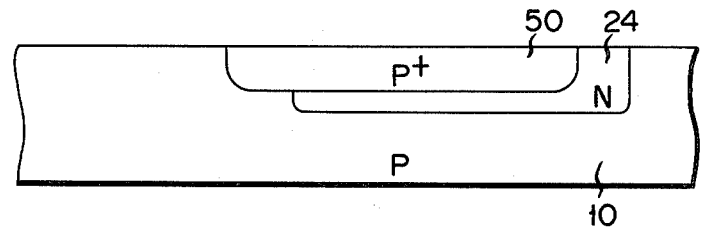

Now, a second embodiment of the invention will be described with reference to FIG. 6. Each transfer channel 20 of shift register 16 is formed in a p+-type semiconductor region 50 having a high impurity concentration compared to semiconductor substrate 10. For the rest, the embodiment is the same as the preceding first embodiment, so like parts are designated by like reference numerals and symbols in FIG. 6 and are not described in any further detail. Here, the n-type semiconductor region 24 and p+-type semiconductor region 50 are formed through a process as shown in FIGS. 7A and 7B. An n-type semiconductor layer 52 with a thickness of several $\mu$, as shown in FIG. 7A, is formed in a given superficial portion of a p-type semiconductor substrate 10 by ion implanting and thermally diffusing an n-type impurity. Then, a p-type impurity is ion implanted in a superficial portion of the n-type semiconductor layer 52, and is then thermally diffused, thereby obtaining the p+-type semiconductor region 50 and n-type semiconductor region 24, as shown in FIG. 7B. The charge transfer imaging device as shown in FIG. 6 is formed using the semiconductor substrate 10 which is formed in the above way.

In the charge transfer imaging device thus formed, each transfer channel 20 of the shift register 16 is formed in the p+-type semiconductor region 50 which has a higher impurity concentration than the semiconductor substrate 10. Thus, the intrusion of electrons generated in the substrate into the shift register 16 can be further reduced by a diffusion potential effect that is obtained at the interface between the p-type substrate 10 and p+-type semiconductor region 50. Generally, an effect similar to that noted above can be obtained where a p+-type semiconductor region is present in a route, through which electrons generated in the semiconductor substrate 10 are led to the transfer channel 20.

With the second embodiment of the charge transfer imaging device, it is also possible to improve the detection sensitivity when a light source emitting long wavelength light is used for imaging and also to prevent unnecessary electrons from reaching the transfer channel when a light source emitting highly intense light is used.

While in the previous first and second embodiments the photosensitive sites were formed in a one-dimensional arrangement, they may formed in a two-dimensional arrangement as well. Further, the transfer channels of the shift register 16 may be n-type buried channels. Further, an n-type semiconductor may be used as the semiconductor substrate 10. In this case, the other semiconductor layers are of correspondingly opposite conductivity types.

What is claimed is:

1. A charge transfer imaging device comprising:

a semiconductor substrate of a first conductivity type;

photosensitive sites formed in superficial portions of said semiconductor substrate for generating and storing signal charge in response to an incident light signal, said photosensitive sites being first semiconductor regions of a second conductivity type;

a shift electrode for controlling the transfer of said signal charge through said semiconductor substrate;

a charge transfer shift register for reading out said signal charge by transferring the same from said shift electrode through transfer channels formed in and continuous to the surface of said semiconductor substrate;

a second semiconductor region formed in said semiconductor substrate other than a portion of the substrate below said photosensitive sites and at least under said transfer channels of said shift register; and means for applying a reverse bias voltage between said second semiconductor region and said semiconductor substrate.

2. A charge transfer imaging device according to claim 1, wherein:

said transfer channels are of the same conductivity type as said semiconductor substrate and are each formed in a third semiconductor region containing a higher concentration of impurity than said semiconductor substrate, and said second semiconductor region is formed under and contiguous to said third semiconductor region.

3. A charge transfer imaging device according to claim 1, wherein:

said transfer channels form p-n junctions with said first semiconductor region.

* * * * *